United States Patent
Hirano et al.

(10) Patent No.: US 6,908,717 B2
(45) Date of Patent: Jun. 21, 2005

(54) POSITIVE PHOTOSENSITIVE RESIN COMPOSITION, PROCESS FOR ITS PREPARATION, AND SEMICONDUCTOR DEVICES

(75) Inventors: Takashi Hirano, Tokyo (JP); Shusaku Okaaki, Tokyo (JP); Michael D. Goodner, Hillsboro, OR (US); Robert P. Meagley, Hillsboro, OR (US)

(73) Assignees: Sumitomo Bakelite Company Limited, Tokyo (JP); Intel Corporation, Santa Clara, CA (US)

( * ) Notice: Subject to any disclaimer, the term of this patent is extended or adjusted under 35 U.S.C. 154(b) by 0 days.

(21) Appl. No.: 10/415,234

(22) PCT Filed: Oct. 9, 2001

(86) PCT No.: PCT/JP01/08858

§ 371 (c)(1),
(2), (4) Date: Apr. 25, 2003

(87) PCT Pub. No.: WO02/37184

PCT Pub. Date: May 10, 2002

(65) Prior Publication Data

US 2004/0023147 A1 Feb. 5, 2004

(30) Foreign Application Priority Data

Oct. 31, 2000 (JP) ........................................ 2000-333560

(51) Int. Cl.$^7$ ............................................... G03F 7/023
(52) U.S. Cl. ........................ 430/18; 430/165; 430/168; 430/191; 430/192; 430/193
(58) Field of Search .......................... 430/18, 165, 168, 430/191, 192, 193

(56) References Cited

U.S. PATENT DOCUMENTS

| | | | |
|---|---|---|---|
| 2,772,972 A | 12/1956 | Herrick, Jr. et al. | |
| 2,797,213 A | 6/1957 | Moore | |
| 3,669,658 A | 6/1972 | Yonezawa et al. | |
| 5,368,991 A | * 11/1994 | Uchikawa et al. | ....... 430/288.1 |
| 6,183,935 B1 | * 2/2001 | Hanabata et al. | ........ 430/270.1 |
| 6,534,235 B1 | * 3/2003 | Hanabata et al. | ........... 430/191 |

FOREIGN PATENT DOCUMENTS

| | | |
|---|---|---|
| JP | 1-46862 | 10/1989 |
| JP | 3-200251 | 9/1991 |
| JP | 3-200252 | 9/1991 |
| JP | 3-200253 | 9/1991 |
| JP | 3-200254 | 9/1991 |
| JP | 4-1650 | 1/1992 |
| JP | 4-1651 | 1/1992 |
| JP | 4-11260 | 1/1992 |
| JP | 4-12356 | 1/1992 |
| JP | 4-12357 | 1/1992 |
| JP | 9-302221 | 11/1997 |
| JP | 10-87960 | 4/1998 |
| JP | 11-52570 | 2/1999 |
| JP | 11-102069 | 4/1999 |
| JP | 2001-142209 | 5/2001 |

OTHER PUBLICATIONS

International Search Report, dated Jan. 15, 2002, issued by the Japanese Patent Office, for International Application No. PCT/JP01/08858. (3 pages).

* cited by examiner

*Primary Examiner*—John S. Chu
(74) *Attorney, Agent, or Firm*—Smith, Gambrell & Russell, LLP

(57) ABSTRACT

The present invention provides a positve photosensitive resin composition of high sensitivity which can form a pattern of high resolution and high residual film ration and which can give a cured film superior in mechanical properties, adhesivity and water absorptivity. That is, the present invention lies in a positive photosensitve resin compostion comprising 100 parts by weight of an alkali-soluble resin, 1 to 100 parts by weight of a photosensitve diazoquinone compound (B) and a filler (C), characterized in that content F of the filler (C) represented by the following formula is 2 to 70% by weight.

$$F = filler(C)/[alkali\text{-}soluble\ resing + filler\ (C)]$$

12 Claims, 1 Drawing Sheet

POSITIVE PHOTOSENSITIVE RESIN COMPOSITION, PROCESS FOR ITS PREPARATION, AND SEMICONDUCTOR DEVICES

TECHNICAL FIELD

The present invention relates to a positive photosensitive resin composition of high sensitivity which can form a pattern of high resolution and high residual film ratio, which contains a filler and thereby is superior in mechanical properties, adhesivity and water absorptivity, and which can be developed with an aqueous alkali solution; as well as to a process for producing such a resin composition. The present invention relates further to a semiconductor device produced by using the present positive photosensitive resin composition.

BACKGROUND ART

Polyimide resins superior in heat resistance and outstanding in electrical properties, mechanical properties, etc. have been used in the surface-protecting film and interlayer dielectric of a semiconductor chip. Meanwhile, in recent years, semiconductor chips have become more highly integrated and larger, resin-encapsulated packages have become thinner and smaller, and surface mounting by reflow soldering has come to be adopted; for these and other reasons, significant improvements in heat cycle resistance, thermal shock resistance, etc. have come to be required for polyimide resins, and a polyimide resin of higher performance has become necessary.

Meanwhile, attention has recently been paid to a technique of allowing a polyimide resin itself to have photosensitivity. Photosensitive polyimide resins include, for example, one represented by the following formula (3).

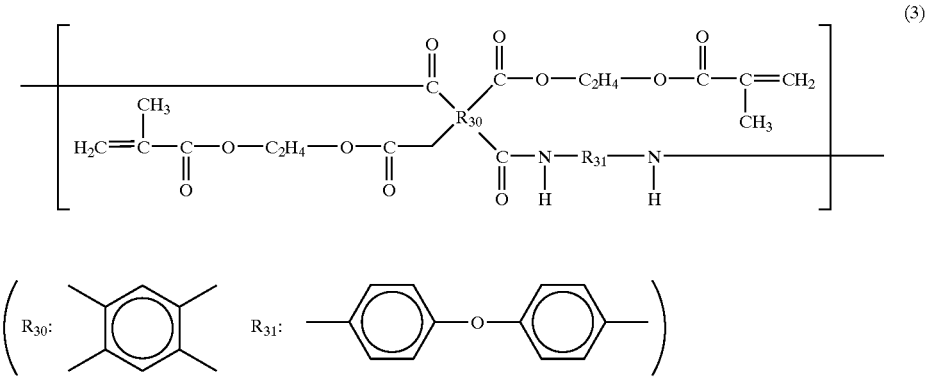

Use of the above resin enables simplification of a part of pattern formation step and shortening of the step but requires, in development, a solvent such as N-methyl-2-pyrrolidone or the like, posing a problem in safety and handling. Hence, positive photosensitive resins which can be developed with an aqueous alkali solution, have been developed recently. In, for example, JP-B-1-46862 there is disclosed a positive photosensitive resin constituted by a polybenzoxazole precursor and a diazoquinone compound. This resin has high heat resistance, excellent electrical properties and fine processability, and is usable as a wafer-coating resin and further may be used as a resin for interlayer insulation. As to the mechanism of development of this positive photosensitive resin, the diazoquinone compound which is insoluble in aqueous alkali solution when unexposed to a light, gives rise to a chemical change when exposed to a light and becomes soluble in aqueous alkali solution. Owing to this difference in solubility in aqueous alkali solution between exposed portion and unexposed portion, it is possible to form a coating pattern constituted by the unexposed portion alone.

In recent years, photosensitive resins have been strongly required to have, in particular, a high sensitivity. The reason is that, with a low sensitivity, the exposure time per one wafer is long, resulting in a low through-put. In order for a photosensitive resin to have a high sensitivity, it is considered to, for example, make smaller the molecular weight of a polybenzoxazole as a base resin. With this approach alone, however, film thinning of unexposed portion during development is large, making it impossible to obtain a desired film thickness and, moreover, giving a pattern of inferior shape. Further, the cured film formed by thermal dehydration and ring closure is significantly low in mechanical properties. For these reasons, it has been desired to develop a photosensitive resin satisfying the above properties and yet having a high sensitivity.

In addition, in recent years, wafers, in particular, have become larger and wafers of 300 mm have come to be used. With a large wafer, however, warpage arises owing to a difference in linear expansion coefficient between silicon wafer and photosensitive resin and there are problems, for example, cracking of wafer in back side grinding step for wafer thinning. Therefore, it has been desired to develop a photosensitive resin of low stress having a linear expansion coefficient close to that of silicon wafer.

DISCLOSURE OF THE INVENTION

The present invention aims at providing a positive photosensitive resin of high sensitivity which can be developed with an aqueous alkali solution, which can form a pattern of high resolution and high residual film ratio, and which can give a cured film superior in mechanical properties, adhesivity and water absorptivity.

The present invention lies in a positive photosensitive resin composition comprising 100 parts by weight of an alkali-soluble resin, 1 to 100 parts by weight of a photosensitive diazoquinone compound (B) and a filler (C), characterized in that content F of the filler (C) represented by the following formula is 2 to 70% by weight.

$$F = \text{filler (C)}/[\text{alkali-soluble resin} + \text{filler (C)}]$$

In a preferred embodiment of the present positive photosensitive resin composition, the alkali-soluble resin is a polyamide (A) represented by the following general formula (1); a phenol compound (D) represented by the following general formula (2) is contained in an amount of 1 to 30 parts by weight relative to 100 parts by weight of the alkali-soluble resin; the filler (C) is selected from the group consisting of silica, aluminum oxide and zirconium oxide; and the filler (C) has particle diameters of 1 nm to 1,000 nm:

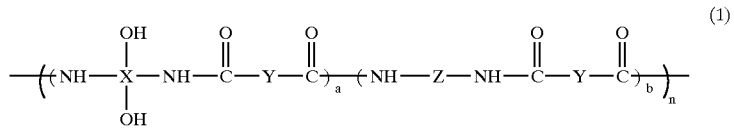

(1)

wherein X is a tetravalent aromatic group; Y is a bivalent aromatic group; Z is a group represented by

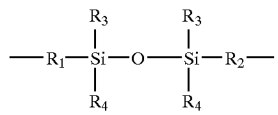

wherein $R_1$ and $R_2$ are each a bivalent organic group, and $R_3$ and $R_4$ are each a monovalent organic group; a and b are each a mole fraction; a+b=100 mole %; a=60.0 to 100.0 mole %; b=0 to 40.0 mole %; and n=2 to 500,

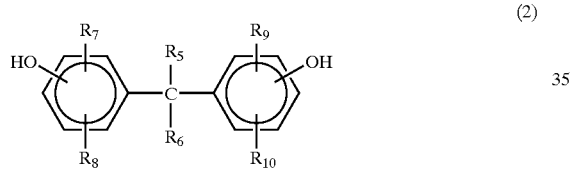

(2)

wherein $R_5$ and $R_6$ are each hydrogen atom or an alkyl group; and $R_7$, $R_8$, $R_9$ and $R_{10}$ are each one atom or group selected from hydrogen atom, halogen atom, hydroxyl group, alkoxy group, cycloalkyl group and alkyl group.

The present invention lies also in a process for producing a positive photosensitive resin composition, which comprises dispersing a filler (C) in a solution by use of a dispersing agent and then dissolving, in the resulting solution, an alkali-soluble resin and a photosensitive diazoquinone compound (B).

The present invention lies also in a semiconductor device produced by using the above positive photosensitive resin composition, preferably a semiconductor device for mounting of a flip chip.

BRIEF DESCRIPTION OF THE DRAWING

In FIG. 1, individual numerals refer to the followings.

Figure 1:
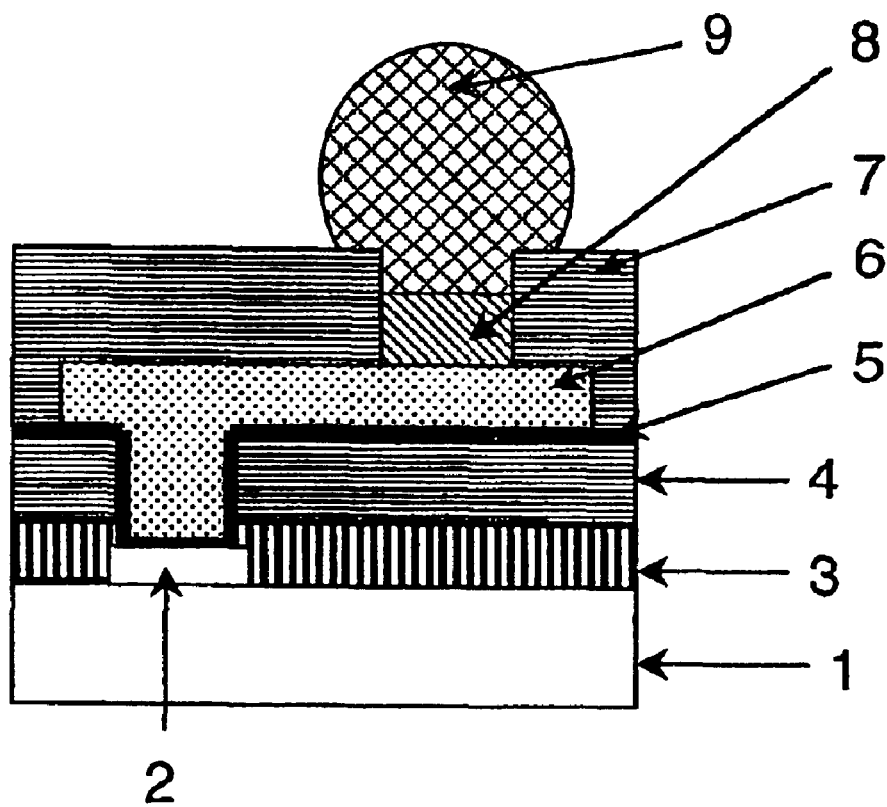
FIG. 1 is a schematic sectional view showing an example of the semiconductor device of the present invention.

1: silicon wafer; 2: Al pad; 3: passivation film; 4: buffer coating film; 5: metal (e.g. Cr or Ti) film; 6: wiring (e.g. Al or Cu); 7: insulating film; 8: barrier metal; 9: solder bump

DETAILED DESCRIPTION OF THE INVENTION

As the alkali-soluble resin, there are, for example, hydroxypolyamide, polyamic acid and phenolic novolac. In order to satisfy both heat resistance and photosensitivity, hydroxypolyamide is preferred, and one represented by the general formula (1) is particularly preferred.

The polyamide (A) represented by the general formula (1) is mainly constituted by a bisaminophenol having an X structure and a dicarboxylic acid having a Y structure. The polyamide (A), when heated to about 300 to 400° C., gives rise to ring closure and changes to a polybenzoxazole which is a heat-resistant resin.

The X of the polyamide (A) of the present invention represented by the general formula (1) includes, for example,

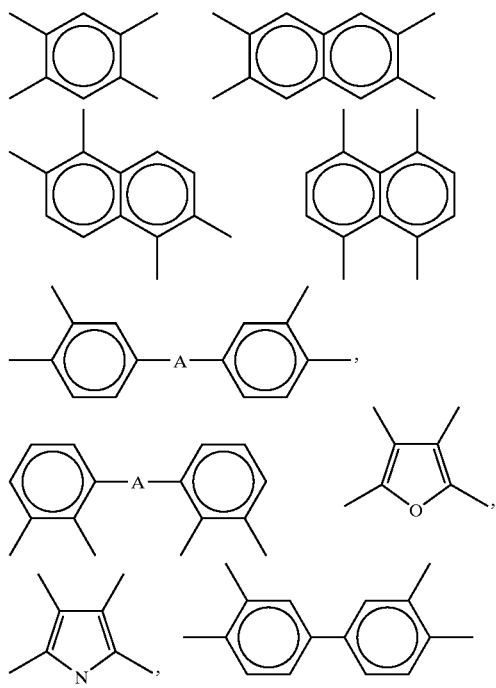

wherein A is —$CH_2$—, —$C(CH_3)_2$—, —O—, —S—, —$SO_2$—, —CO—, NHCO— or —$C(CF_3)_2$—; however, is not restricted thereto.

Of these, one giving a composition of particularly high sensitivity is selected from the followings.

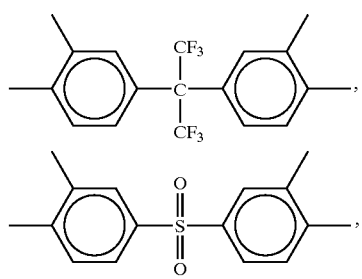

-continued

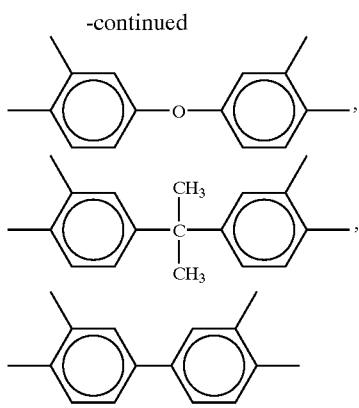

The Y of the general formula (1) includes, for example,

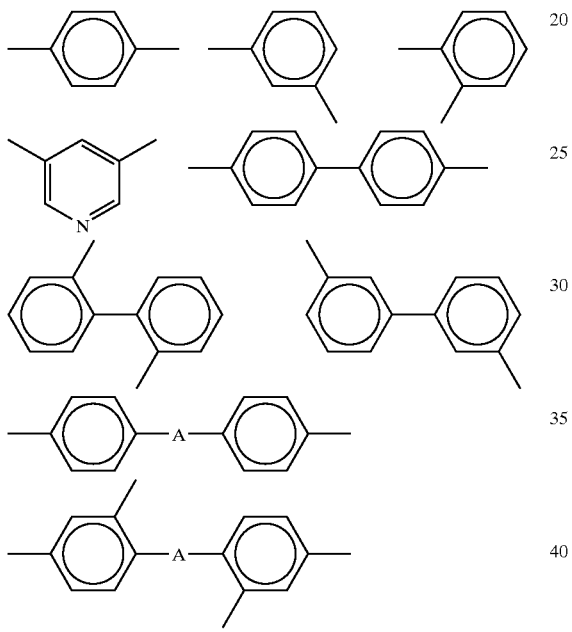

wherein A is —CH$_2$—, —C(CH$_3$)$_2$—, —O—, —S—, —SO$_2$—, —CO—, —NHCO— or —C(CF$_3$)$_2$—; however, is not restricted thereto.

Of these, one giving a composition of particularly high sensitivity is selected from the followings.

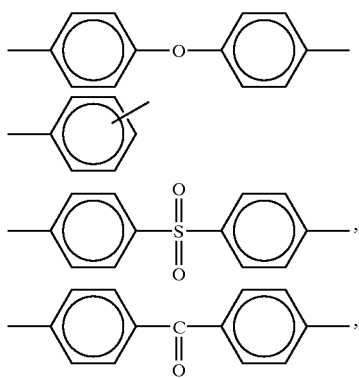

The Z of the general formula (1) includes, for example,

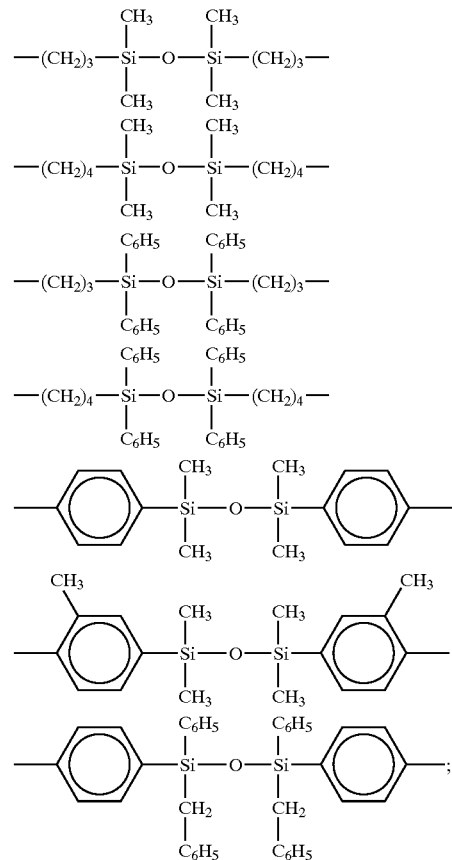

however, is not restricted thereto.

The Z of the general formula (1) is used, for example, when, in particular, adhesivity is needed against a substrate such as silicon wafer or the like. The proportion b of Z used is maximum 40 mole %. When b is more than 40 mole %, the resin is very low in solubility and scum is formed, making patterning impossible. X, Y and Z may be each used in one or more kinds.

The photosensitive diazoquinone compound (B) used in the present invention is a compound having a 1,2-benzoquinone diazide or 1,2-naphthoquinone diazide structure and is a known substance in U.S. Pat. Nos. 2,772,972, 2,797,213 and 3,669,658. There can be mentioned, for example, the followings.

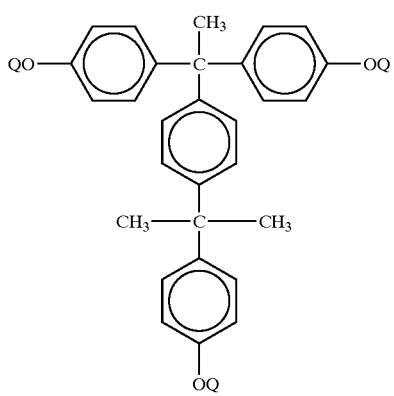

-continued

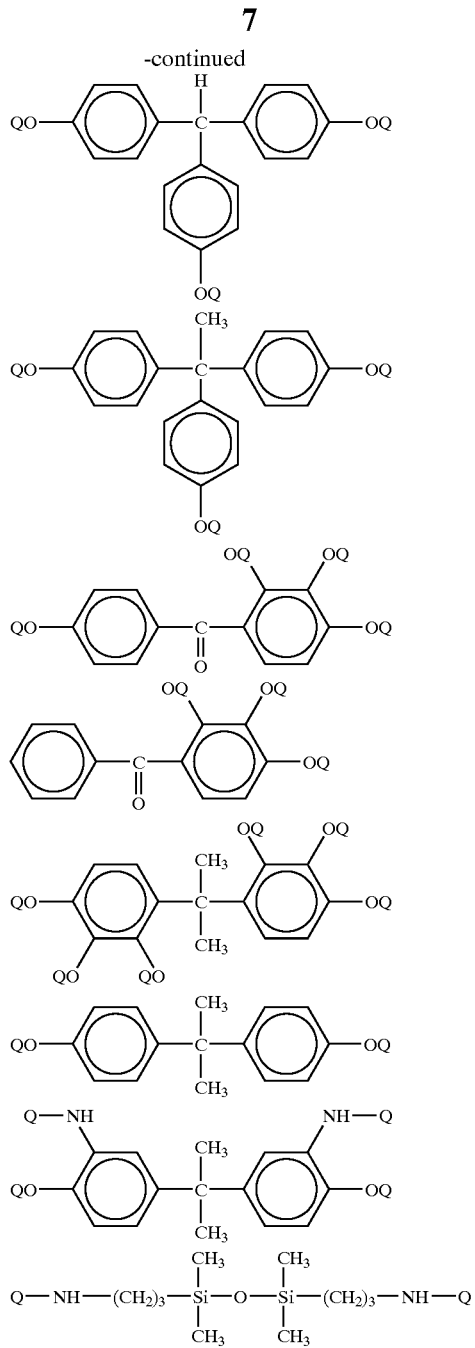

In the above, each Q is hydrogen atom or

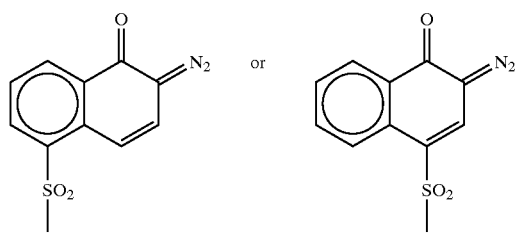

Of these, particularly preferred are the followings from the standpoint of high residual film ratio.

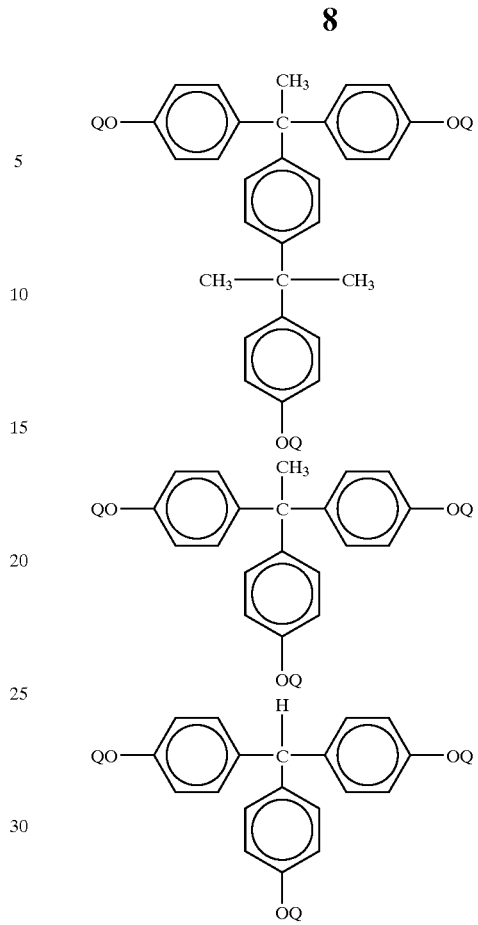

In the above, each Q is selected from hydrogen atom or

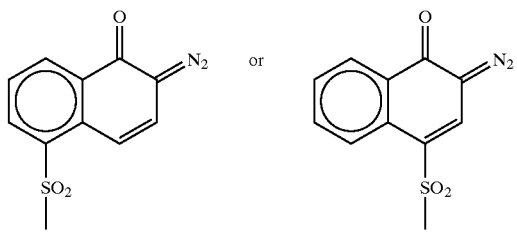

and, in each compound, at least one Q is

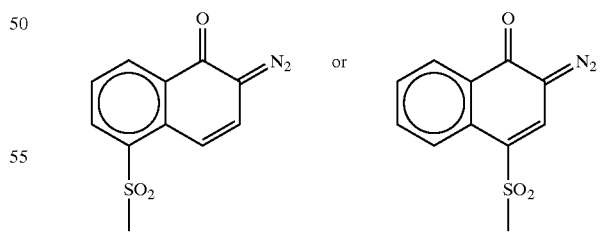

The amount of the photosensitive diazoquinone compound (B) added to the alkali-soluble resin is 1 to 100 parts by weight relative to 100 parts by weight of the alkali-soluble resin. When the addition amount is less than 1 part by weight, patterning ability of the resin is inferior. Meanwhile, when the addition amount is more than 100 parts by weight, the degree of tensile elongation of the film formed is extremely low.

In order to enhance the photosensitivity of the positive photosensitive resin composition of the present invention, it is possible to add, as necessary, a dihydroxypyridine derivative to the composition. As the dihydroxypyridine derivative, there can be mentioned, for example, 2,6-dimethyl-3,5-diacetyl-4-(2'-nitrophenyl)-1,4-dihydroxypyridine, 4-(2'-nitrophenyl)-2,6-dimethyl-3,5-dicarboethoxy-1,4-dihydroxypyridine, and 4-(2',4'-dinitrophenyl)-2,6-dimethyl-3,5-carbomethoxy-1,4-dihydroxypyridine.

The filler (C) used in the present invention includes an organic filler, an inorganic filler and a pigment. These may be used singly or in admixture of two or more kinds. The organic filler includes, for example, epoxy resin, melamine resin, urea resin, acrylic resin, phenolic resin, polyimide resin, polyamide resin, polyester resin and teflon resin. As the inorganic filler, there are used metal oxide fine particles of alumina, silica, magnesia, ferrite, aluminum oxide, zirconium oxide or the like, or fine particles of silicate (e.g. talc, mica, kaolin or zeolite), barium sulfate, calcium carbonate, fullerene or the like. The above fillers are used singly or in admixture of two or more kinds. Aluminum oxide and zirconium oxide are particularly preferred because they produce no thixotropy after mixing and enable uniform coating by a spinner. Silica is also preferred from the standpoints of linear expansion coefficient of cured material and cost.

The filler (C) is preferred to be fine particles having an average particle diameter of 1 to 1,000 nm and more preferred to be fine particles having an average particle diameter of 1 to 100 nm. An average particle diameter of more than 1,000 nm is not preferred because it incurs a reduction in resolution and sensitivity. An average particle diameter of less than 1 nm makes mixing difficult.

The content F of the filler (C) is represented by the following formula.

$$F = \text{filler } (C)/[\text{alkali-soluble resin} + \text{filler } (C)]$$

The content F (based on weight) of the filler is 2 to 70% by weight, preferably 2 to 50% by weight. A content of less than 2% by weight shows no addition effect. A content of more than 70% by weight results in an extremely long development time or no formation of cured film.

The pigment used in the present invention includes, for example, a coloring pigment such as titanium oxide or the like.

In the positive photosensitive resin composition of the present invention, it is preferred that a phenol compound (D) represented by the general formula (2) is also contained.

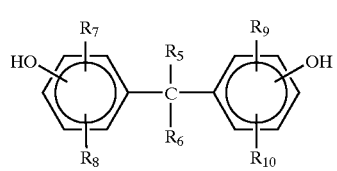
(2)

wherein $R_5$ and $R_6$ are each hydrogen atom or an alkyl group; and $R_7$, $R_8$, $R_9$ and $R_{10}$ are each one atom or group selected from hydrogen atom, halogen atom, hydroxyl group, alkoxy group, cycloalkyl group and alkyl group.

The technique of adding the phenol compound to a positive resist composition is disclosed in, for example, JP-A-3-200251, JP-A-3-200252, JP-A-3-200253, JP-A-3-200254, JP-A-4-1650, JP-A-4-1651, JP-A-4-11260, JP-A-4-12356 and JP-A-4-12357. However, the phenol compounds mentioned in these literatures show a small sensitivity increase when used in the positive photosensitive resin composition of the present invention using a polyamide as the base resin.

Meanwhile, when the phenol compound of the present invention represented by the general formula (2) is used, the dissolution rate of exposed portion is high, resulting in an increased sensitivity. Further, film thinning of unexposed portion which is seen when the molecular weight of the alkali-soluble resin is made smaller for increased sensitivity, is very small.

In the present invention, it was found out that addition of the phenol compound represented by the general formula (2) provides a further advantage that a positive photosensitive resin composition improved in adhesion against an encapsulating resin can be obtained.

As the compound represented by the general formula (2), there can be mentioned the followings, but the compound is not restricted thereto.

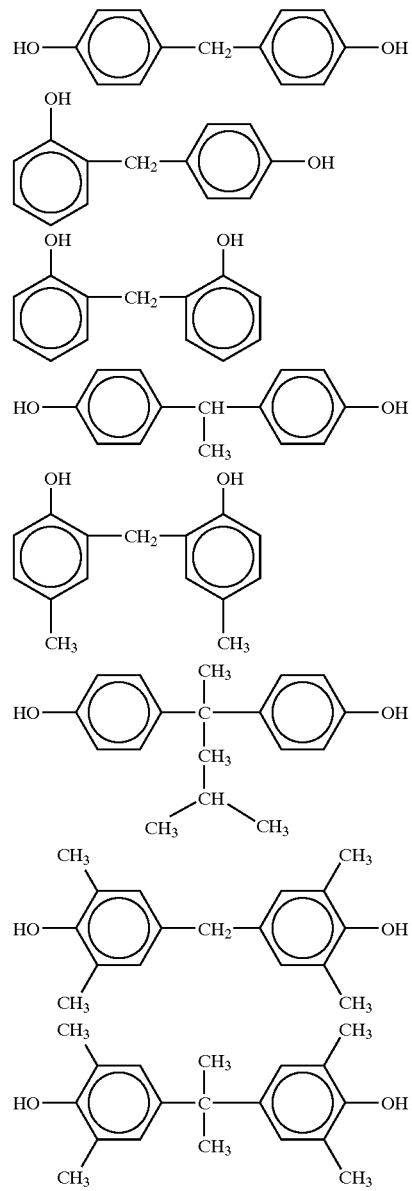

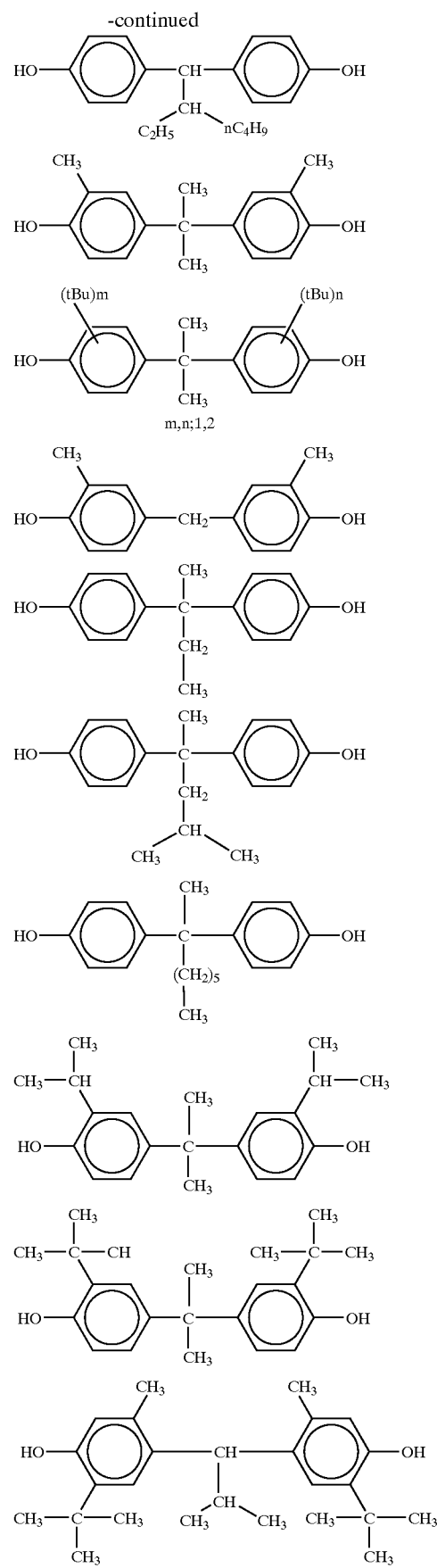
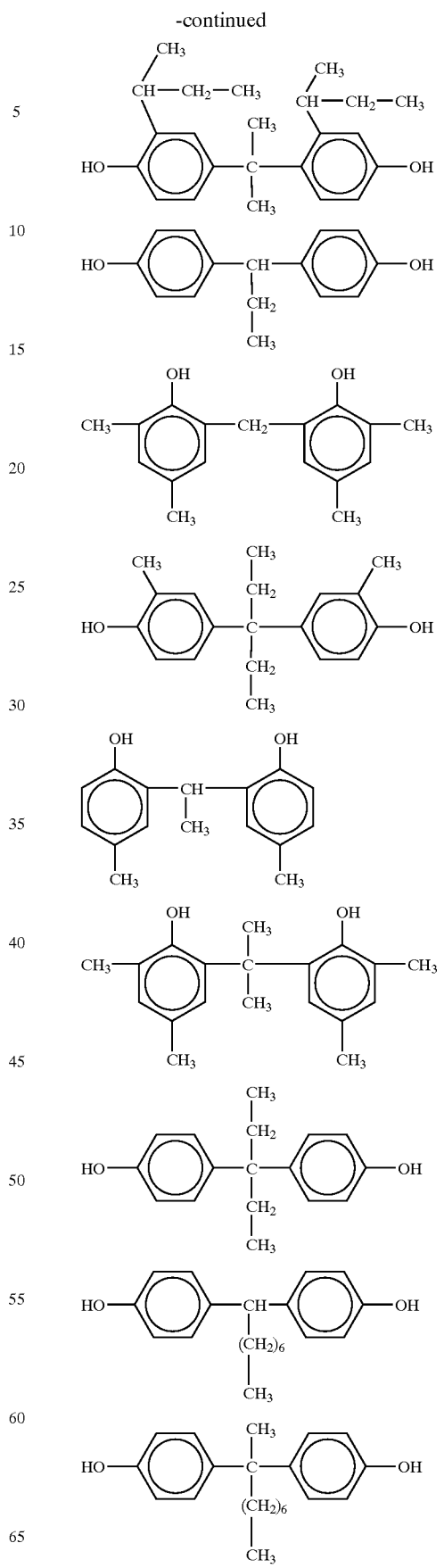

-continued

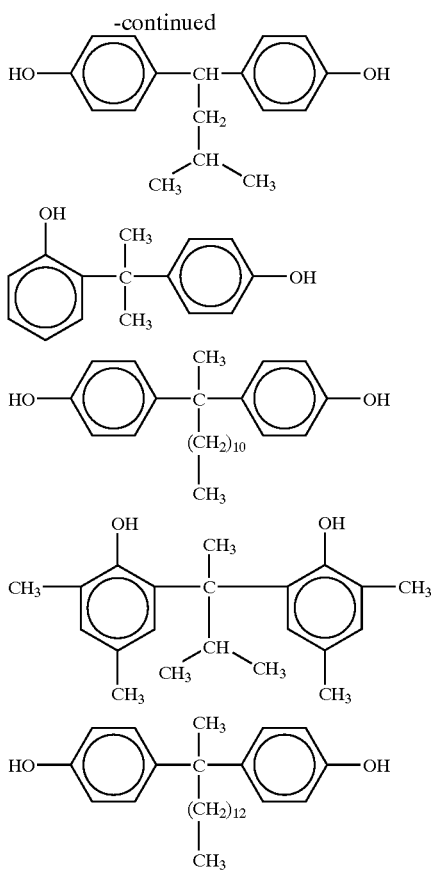

Of these, particularly preferred compounds from the standpoint of sensitivity and residual film ratio are as follows.

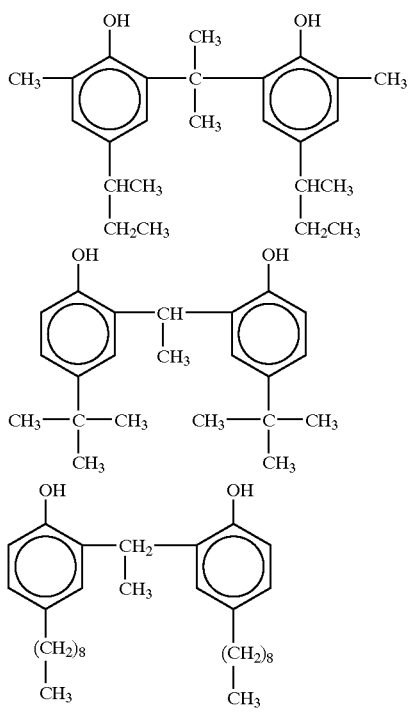

-continued

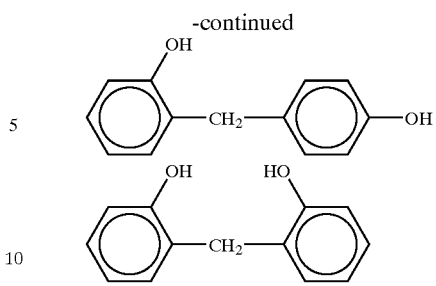

The phenol compound (D) represented by the general formula (2) may be used solely but may also be used in combination with a phenol compound mentioned in the above literatures. In the latter case, the phenol compound represented by the general formula (2) occupies 50% by weight or more of the total phenol compounds.

The amount of the total phenol compounds used is preferably 1 to 50 parts by weight relative to 100 parts by weight of the alkali-soluble resin. The amount of the phenol compound (D) represented by the general formula (2) is preferably 1 to 30 parts by weight relative to 100 parts by weight of the alkali-soluble resin. When the amount is less than 1 part by weight, there is no sensitivity increase. When the amount is more than 30 parts by weight, there is a large reduction in residual film ratio, precipitation takes place during cryopreservation, and there is no practical applicability.

To the positive photosensitive resin composition of the present invention there can be added, as necessary, additives such as leveling agent, silane coupling agent and the like.

In the present invention, these components are dissolved in a solvent and are used in a varnish form. As the solvent, there can be used, for example, N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate and methyl-3-methoxypropionate, singly or in admixture.

With regard to a process for producing the positive photosensitive resin composition of the present invention, it is preferred that in mixing the filler, the alkali-soluble resin, the photosensitive material, etc. into an organic solvent or the like, the filler is uniformly dispersed in the resulting resin composition. Hence, in order to prevent secondary agglomeration of the filler, the filler is beforehand dispersed uniformly in the solvent using a dispersing agent and then the alkali-soluble resin, the photosensitive material, etc. are dissolved to obtain a uniform varnish. As the dispersing agent, there can be mentioned, for example, an anionic active agent, a cationic active agent, a nonionic active agent and an amphoteric active agent. Of these, a cationic active agent and a nonionic active agent are preferred. Of these, a phosphoric acid ester type active agent is preferred.

Dispersion can be conducted by a known method. For example, by using a dispersing machine of high shear force such as ball mill, roll mill, diamond mill or the like, there can be obtained a photosensitive resin composition of good dispersion and mixing. For better dispersion and mixing, it is possible to add a wetting agent, a dispersing agent, a silane coupling agent, a titanium coupling agent, an antifoaming agent, etc., or to make the filler hydrophobic beforehand.

In using the positive photosensitive resin composition of the present invention, first, the composition is coated on an appropriate substrate, for example, a silicon wafer, a ceramic or an aluminum substrate. The coating is conducted by spin coating using a spinner, spray coating using a spray coater, dipping, printing, roll coating, etc. Next, prebaking is conducted at 60 to 120° C. to dry the coating film and then an actinic ray is applied in a desired pattern shape. As the actinic ray, there can be used an X ray, an electron beam, an ultraviolet light, a visible light, etc. with one having a wavelength of 200 to 500 nm being preferred. Next, the exposed portion is dissolved and removed using a developing solution to obtain a relief pattern.

As the developing solution, there can be suitably used an aqueous solution of alkali such as inorganic alkali (e.g. sodium hydroxide, potassium hydroxide, sodium carbonate, sodium silicate, sodium metasilicate or ammonia water), primary amine (e.g. ethylamine or n-propylamine), secondary amine (e.g. diethylamine or di-n-propylamine), tertiary amine (e.g. triethylamine or methyldiethylamine), alcoholamine (e.g. dimethylethanolamine or triethanolamine), quaternary ammonium salt (e.g. tetramethylammonium hydroxide or tetraethylammonium hydroxide) or the like; or an aqueous solution obtained by adding, to the above aqueous alkali solution, an appropriate amount of a water-soluble organic solvent (e.g. methanol or ethanol) or a surfactant. Development can be conducted by using spray, paddle, dipping, ultrasonic wave or the like. Then, the relief pattern formed by development is rinsed. Distilled water is used as a rinsing liquid. Then, a heat treatment is applied to form an oxazole ring and obtain a final pattern of high heat resistance.

The positive photosensitive resin composition of the present invention can be used to produce a semiconductor device of high reliability. When the resin composition is used to produce, in particular, a semiconductor device for mounting of a flip chip, a significant reduction in cost is obtained also. The positive photosensitive resin composition of the present invention is useful not only in semiconductor device but also in interlayer insulation of multi-layered circuit, cover coating of flexible copper-clad board, solder resist film and the like. Their production can be conducted by a conventional method except that the positive photosensitive resin composition of the present invention is used.

An example of the semiconductor device produced using the positive photosensitive resin composition of the present invention is described referring to FIG. 1.

FIG. 1 is an enlarged sectional view of the pad portion of a semiconductor device having a bump, of the present invention.

As shown in FIG. 1, on a silicon wafer 1, a passivation film 3 is formed on an Al pad 2 for input and output. In the passivation film 3 is formed a via hole. Thereon is formed a polybenzoxazole resin film (a buffer coating film 4). The film 4 is exposed to a light using a g-line stepper, then dipped in a developing solution to dissolve and remove the exposed portion, and rinsed with pure water for 30 seconds to obtain a pattern. Then, curing is conducted in a clean oven in a nitrogen atmosphere at 150° C. for 30 minutes, at 250° C. for 30 minutes and at 350° C. for 30 minutes in this order. Then, reactive ion etching (RIE) is conducted to etch the passivation film 3. Thereon is formed a metal (e.g. Cr or Ti) film 5 by sputtering so that the film 5 is connected to the Al pad 2. The metal film 5 is etched and removed at the periphery of a solder bump 9 for insulation between individual pads.

Next, a wiring 6 is formed by plating. Then, a positive photosensitive resin is coated and a pattern (an insulating film 7) is formed via a photolithography step. Then, a barrier metal 8 and solder are formed by plating. Then, a flux is coated, followed by heating to dissolve the solder. Then, the flux is washed to form a solder bump 9 to obtain a structure of FIG. 1. This structure is diced along a scribing line to obtain individual chips. Best Mode for Carrying Out the Invention The present invention is specifically described below by way of Examples.

EXAMPLE 1

Synthesis of Polyamide 1 mole of diphenyl ether-4,4'-dicarboxylic acid was reacted with 2 moles of 1-hydroxybenzotriazole. 492.5 parts by weight (1 mole) of the resulting dicarboxylic acid derivative and 347.9 parts by weight (0.95 mole) of hexafluoro-2,2-bis(3-amino-4-hydroxyphenyl)propane were fed into a four-necked separable flask provided with a thermometer, a stirrer, a raw material inlet and a dry nitrogen gas-introducing tube. 3,000 parts by weight of N-methyl-2-pyrrolidone was added for dissolution. Then, a reaction was conducted at 75° C. for 12 hours on an oil bath.

Then, the reaction mixture was collected by filtration and poured into a water/methanol (3/1) solution. The resulting precipitate was collected by filtration, washed with water thoroughly, and dried under vacuum to obtain an intended polyamide (A-1).

Production of Positive Photosensitive Resin Composition 10 parts by weight of silica (C-1, average particle diameter: 100 nm, specific surface area: 40 m$^2$/g) and 1 part by weight of a surfactant (Phosphanol RE-610, a product of Toho Chemical Industry Co., Ltd.) were dispersed in 250 parts by weight of γ-butyrolactone using a diamond mill. Therein were added and dissolved 100 parts by weight of the polyamide (A-1) synthesized above and 25 parts by weight of a diazoquinone (B-1) having a structure shown later. Then, filtration was conducted using a 1-μm Teflon filter to obtain a photosensitive resin composition.

Evaluation of Properties

This positive photosensitive resin composition was coated on a silicon wafer using a spin coater, followed by drying on a hot plate at 120° C. for 4 minutes, to obtain a coating film having a thickness of about 7 μm. The coating film was exposed to a light via a reticle, using a g-line stepper NSR-1505G3A (a product of Nikon Corporation), at from 50 mJ/cm$^2$ to 540 mJ/cm$^2$ with an increment of each 20 mJ/cm$^2$.

Then, the light-exposed coating film was dipped in a 2.38% aqueous tetramethylammonium hydroxide solution for 40 seconds to dissolve and remove the exposed portion, followed by rinsing with pure water for 30 seconds. As a result, there was pattern formation from the area at which an exposure of 290 mJ/cm$^2$ was made, and there was no scum at the pattern bottom (sensitivity was 290 mJ/cm2). At this time, the residual film ratio (film thickness after development/film thickness before development) was very high at 92.0%.

Separately, the positive photosensitive resin composition was coated on two silicon wafers in the same manner; then, prebaking was conducted; and heating was made in an oven at 150° C. for 30 minutes, at 250° C. for 30 minutes and at 350° C. for 30 minutes in this order to cure the resin. The cure shrinkage was 15%.

Then, the coated silicon wafer was dipped in a 2% aqueous hydrogen fluoride solution to peel the cured film from the silicon wafer. The peeled film was washed thoroughly with water, dried and measured for linear expansion coefficient by thermal mechanical analysis (TMA). A low value of $3.7\times10^{-5}$ 1/° C. was obtained. Separately, the cured film was dipped in pure water for 24 hours and measured for water absorption. It was 0.2%.

EXAMPLE 2

In the polyamide synthesis of Example 1, there were used 348 parts by weight (0.95 mole) of 2,2-bis(3-amino-4-hydroxyphenyl)hexafluoropropane and 12.4 parts by weight (0.05 mole) of 1,3-bis(3-aminopropyl)-1,1,3,3-tetramethyldisiloxane, whereby was synthesized a polyamide of the general formula (1) wherein X is X-1 shown later, Y is Y-1 shown later, Z is Z-1, a=95, and b=5. The same evaluation as in Example 1 was made.

EXAMPLE 3

In Example 1, the diazoquinone compound was changed to B-2 shown later. The same evaluation as in Example 1 was made.

EXAMPLE 4

In Example 1, 10 parts by weight of a phenol compound (P-1) was added to the positive photosensitive resin composition. The same evaluation as in Example 1 was made.

EXAMPLE 5

In Example 4, the amount of the phenol compound (P-1) added was changed to 5 parts by weight. The same evaluation as in Example 4 was made.

EXAMPLE 6

In Example 1, the silica (C-1) was changed to zirconium oxide (C-2, average particle diameter: 10 nm, specific surface area: 50 m²/g). The same evaluation as in Example 1 was made.

EXAMPLE 7

In Example 1, the amount of silica was changed to 30 parts by weight. The same evaluation as in Example 1 was made.

Comparative Example 1

In Example 1, no silica was added. The same evaluation as in Example 1 was made.

Comparative Example 2

In Example 1, the amount of silica added was increased to 400 parts by weight. The same evaluation as in Example 1 was made.

Comparative Example 3

In Example 1, the amount of silica added was changed to 0.5 part by weight. The same evaluation as in Example 1 was made.

Comparative Example 4

In Example 1, no Phosphanol RE-610 was added to produce a positive photosensitive resin composition.

Secondary agglomeration of silica filler took place and filtration through 1-μm teflon filter was impossible; therefore, it was unable to obtain a good product. No evaluation was made.

Comparative Example 5

100 parts by weight of the above-synthesized polyamide (A-1) was dissolved in 250 parts by weight of γ-butyrolactone. Therein was dissolved 25 parts by weight of a diazoquinone (B-1) having a structure shown later. Then, solid silica was added, followed by stirring. There was no uniform dispersion of silica; filtration through 1-μm teflon filter was impossible; therefore, it was unable to obtain a good product. No evaluation was made.

The resin components used in Examples 1 to 7 and Comparative Examples 1 to 5 are shown below.

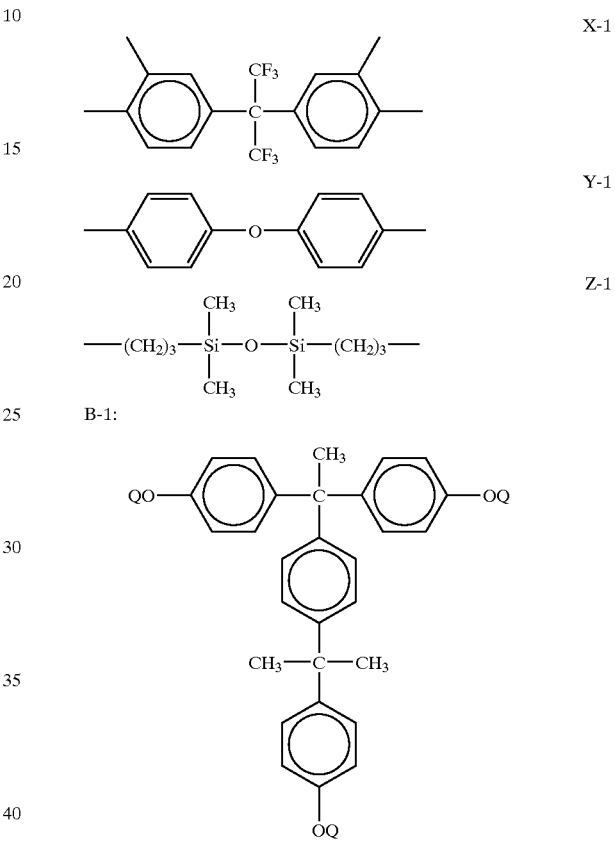

wherein each Q is hydrogen atom or

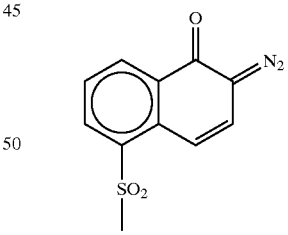

and 70% of the total Q's is

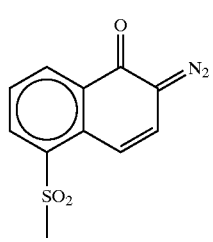

B-2:

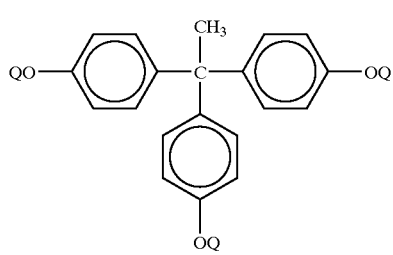

wherein each Q is hydrogen atom or

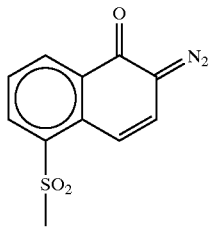

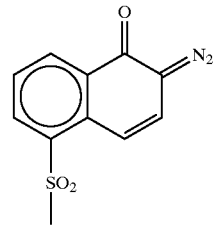

P-1:

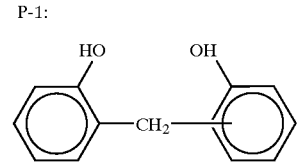

and 70% of the total Q's is

The formulations of the resin compositions used in Examples 1 to 7 and Comparative Examples 1 to 3 are shown in Table 1.

TABLE 1

| | | Polyamide | | | | Photosensitive material | | Filler | | Phenol compound | |
|---|---|---|---|---|---|---|---|---|---|---|---|
| | | Amine | Acid | Silicon diamine | Addition amount (weight parts) | Structure | Addition amount (weight parts) | Structure | Addition amount (weight parts) | Structure | Addition amount (weight parts) |
| Example | 1 | X-1 | Y-1 | — | 100 | B-1 | 25 | C-1 | 10 | — | — |
| | 2 | X-1 | Y-1 | Z-1 | 100 | B-1 | 25 | C-1 | 10 | — | — |
| | 3 | X-1 | Y-1 | — | 100 | B-1 | 25 | C-1 | 10 | — | — |
| | 4 | X-1 | Y-1 | — | 100 | B-1 | 25 | C-1 | 10 | P-1 | 10 |
| | 5 | X-1 | Y-1 | — | 100 | B-1 | 25 | C-1 | 10 | P-1 | 5 |
| | 6 | X-1 | Y-1 | — | 100 | B-1 | 25 | C-1 | 10 | — | — |
| | 7 | X-1 | Y-1 | — | 100 | B-1 | 25 | C-1 | 30 | — | — |
| Comparative Example | 1 | X-1 | Y-1 | — | 100 | B-1 | 25 | — | — | — | — |
| | 2 | X-1 | Y-1 | — | 100 | B-1 | 25 | C-1 | 400 | — | — |
| | 3 | X-1 | Y-1 | — | 100 | B-1 | 25 | C-1 | 0.5 | — | — |

The evaluation results of Examples 1 to 7 and Examples 1 to 3 are shown in Table 2.

TABLE 2

|  |  | Sensitivity mJ/cm$^2$ | Residual film ratio % | Cure shrinkage % | Linear expansion coefficient 1/° C. | Water absorption % |
|---|---|---|---|---|---|---|
| Example | 1 | 290 | 92 | 15 | 3.7 × 10$^{-5}$ | 0.2 |
|  | 2 | 300 | 90 | 15 | 4.0 × 10$^{-5}$ | 0.2 |
|  | 3 | 250 | 93 | 14 | 3.7 × 10$^{-5}$ | 0.2 |
|  | 4 | 230 | 92 | 16 | 3.9 × 10$^{-5}$ | 0.3 |
|  | 5 | 240 | 91 | 16 | 3.9 × 10$^{-5}$ | 0.3 |
|  | 6 | 280 | 93 | 17 | 3.7 × 10$^{-5}$ | 0.2 |
|  | 7 | 310 | 90 | 12 | 2.5 × 10$^{-5}$ | 0.3 |
| Comparative Example | 1 | 350 | 86 | 20 | 5.5 × 10$^{-5}$ | 0.4 |
|  | 2 | 400 | 94 | 3 | Film formation was impossible. | ← |
|  | 3 | 450 | 87 | 20 | 5.5 × 10$^{-5}$ | 0.4 |

As is clear from the above Examples, the present invention has made it possible to provide a positive photosensitive resin composition of high sensitivity which can form a pattern of high resolution and high residual film ratio and which can give a cured film superior in mechanical properties, adhesivity and water absorptivity. Further, by using the positive photosensitive resin composition of the present invention, a semiconductor device of high reliability can be obtained.

Industrial Applicability

The positive photosensitive resin composition of the present invention can be developed by an aqueous alkali solution, can form a pattern of high resolution and high residual film ratio, and can form a film superior in mechanical properties, adhesivity and water absorptivity; therefore, it can be suitably used in a semiconductor device as a surface-protecting film of a chip or as an interlayer dielectric. A semiconductor device produced using the positive photosensitive resin composition of the present invention has high reliability and accordingly can be suitably used in computer, TV, and other electric or electronic appliances.

What is claimed is:

1. A positive photosensitive resin composition comprising 100 parts by weight of an alkali-soluble resin, 1 to 100 parts by weight of a photosensitive diazoquinone compound (B) and a filler (C) having an average particle diameter of 1 nm to 1,000 nm, characterized in that content F of the filler (C) represented by the following formula is 2 to 70% by weight, $$F = \text{filler }(C)/[\text{alkali-soluble resin} + \text{filler}(C)],$$

wherein the alkali-soluble resin is a polyamide (A) represented by the following general formula (1):

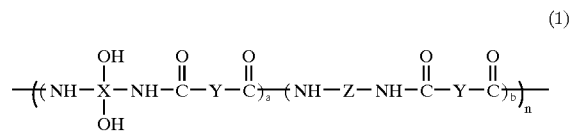

(1)

wherein X is a tetravalent aromatic group; Y is a bivalent aromatic group; Z is a group represented by

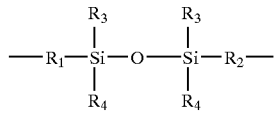

wherein $R_1$ and $R_2$ are each a bivalent organic group, and $R_3$ and $R_4$ are each a monovalent organic group; a and b are each a mole fraction; a+b=100 mole %; a=60.0 to 100.0 mole %; b =0 to 40.0 mole %; and n=2 to 500.

2. A positive photosensitive resin composition according to claim 1, which contains a phenol compound (D) represented by the following general formula (2) in an amount of 1 to 30 parts by weight relative to 100 parts by weight of the alkali-soluble resin:

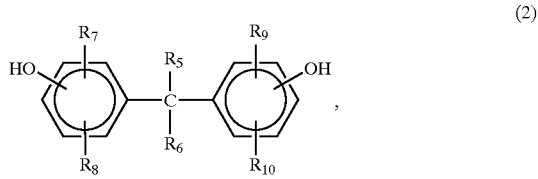

(2)

wherein $R_5$ and $R_6$ are each hydrogen atom or an alkyl group; and $R_7$, $R_8$, $R_9$ and $R_{10}$ are each one atom or group selected from hydrogen atom, halogen atom, hydroxyl group, alkoxy group, cycloalkyl group and alkyl group.

3. A positive photosensitive resin composition according to claim 1, wherein the X in the polyamide (A) of the general formula (1) is selected from the followings.

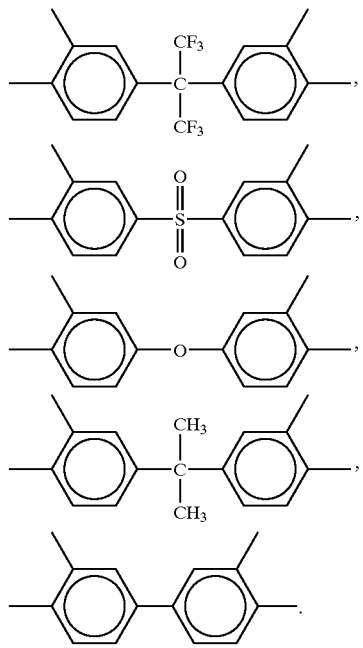

4. A positive photosensitive resin composition according to claim 1, wherein the Y in the polyamide (A) of the general formula (1) is selected from the followings.

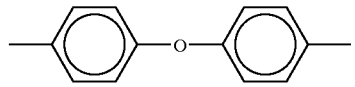

-continued

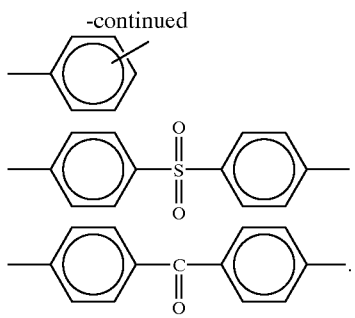

5. A positive photosensitive resin composition according to claim 1, wherein the filler (C) is selected from the group consisting of silica, aluminum oxide and zirconium oxide.

6. A process for producing a positive photosensitive resin composition, characterized by dispersing a filler (C) having an average particle diameter of 1 nm to 1,000 nm in a solvent by use of a dispersing agent and then dissolving, in the resulting dispersion, 100 parts by weight of an alkali-soluble resin and 1 to 100 parts by weight of a photosensitive diazoquinone compound (B) so that content F of the filler (C) represented by the following formula can be 2 to 70% by weight, F=filler (C)/[alkali-soluble resin+filler (C)], wherein the alkali-soluble resin is a polyamide (A) represented by the general formula (1).

7. A process for producing a positive photosensitive resin composition according to claim 6, wherein the positive photosensitive resin composition contains a phenol compound (D) represented by the general formula (2) in an amount of 1 to 30 parts by weight relative to 100 parts by weight of the alkali-soluble resin and the phenol compound (D) is added after the filler (C) has been dispersed in the solution by use of the dispersing agent.

8. A process for producing a positive photosensitive resin composition according to claim 6, wherein the filler (C) is selected form the group consisting of silica, aluminum oxide and zirconium oxide.

9. A semiconductor device produced by using a positive photosensitive resin composition set forth in any of claims 1.

10. A semiconductor device according to claim 9, which is for mounting of a flip chip.

11. A semiconductor device having applied thereto a coating comprising the positive photosensitive resin composition according to claim 1.

12. A surface coated with the positive photosensitive resin composition according to claim 1.

* * * * *